United States Patent [19]

Jung

[11] Patent Number: 4,507,710
[45] Date of Patent: Mar. 26, 1985

[54] ELECTRONIC COMPONENTS AND SYSTEM CARRIER ASSEMBLY

[75] Inventor: Albert Jung, Taufkirchen, Fed. Rep. of Germany

[73] Assignee: Siemens Aktiengesellschaft, Berlin and Munich, Fed. Rep. of Germany

[21] Appl. No.: 396,146

[22] Filed: Jul. 7, 1982

[30] Foreign Application Priority Data

Jul. 23, 1981 [DE] Fed. Rep. of Germany ....... 3129134

[51] Int. Cl.³ .............................................. H05K 7/20
[52] U.S. Cl. ................................ 361/428; 174/52 FP; 361/400; 361/419
[58] Field of Search ............... 361/380, 400, 401, 403, 361/405, 406, 407, 414, 428; 174/52 FP, 52 R; 228/180 A; 357/80

[56] References Cited

U.S. PATENT DOCUMENTS

| 3,868,725 | 2/1975 | De Graaff | 174/52 FP |
| 4,044,201 | 8/1977 | Wallick | 174/52 FP |
| 4,068,910 | 1/1978 | Brown et al. | 361/414 |
| 4,378,902 | 4/1983 | Fedak | 228/180 A |

FOREIGN PATENT DOCUMENTS

| 2236007 | 2/1972 | Fed. Rep. of Germany | 174/52 FP |
| 1227995 | 3/1968 | United Kingdom | 174/52 FP |

Primary Examiner—A. D. Pellinen
Assistant Examiner—Gregory D. Thompson
Attorney, Agent, or Firm—Herbert L. Lerner; Laurence A. Greenberg

[57] ABSTRACT

In an assembly of electronic components, including elemental electronic components, subassemblies or integrated circuits insertable into housings, and a system carrier having a surrounding injection-molded housing base of thermoplastic material, active zones of the electronic components and external electric terminals of the system carrier having electrical contacts connected by wires bonded thereto, the improvement therein including a web of thermoplastic material disposed between at least one of the contacts of the system carrier, on the one hand, and at least one of the contacts of the electronic components, on the other hand, and spacing the bonded wires away from the system carrier.

2 Claims, 3 Drawing Figures

ELECTRONIC COMPONENTS AND SYSTEM CARRIER ASSEMBLY

BACKGROUND OF THE INVENTION

The invention relates to an assembly of electronic components, and more particularly, to elemental electronic components, subassemblies or integrated circuits insertable into housings, for example, of metal or plastic material with a system carrier having a surrounding injection-molded housing base of thermoplastic material, active zones of the electronic components and external electric terminals of the system carrier having electrical contacts connected by wire bonding.

DESCRIPTION OF THE PRIOR ART

In the manufacture of electric components, especially integrated circuits and surface wave (SAW) filters, the active chip zones are connected by wire bonds to the terminals of the housing, i.e. to the contacts of the external contact elements thereof facing into the interior of the housing. The wire is run or extends arcuately between the contacts to be connected. In the case of system carriers which have previously been surrounded by an injection-molded housing base of thermoplastic material, the wire may adhere to the system carrier or to the housing base and the required arcuate shape of the wire may be disturbed due to heating of the system carrier during the wire bonding. In such cases, the wire does not have the required spacing from other electric potentials and causes a short circuit, respectively, and, thereby, failure of the respective electronic component.

SUMMARY OF THE INVENTION

This equipment-related problem can be affected or influenced favorably by improving the mechanical course or performance of the bonding operation. It is, accordingly, an object of the innovation to provide a solution to this problem which is independent of the equipment used.

With the foregoing and other objects in view, there is provided, in accordance with the invention, an assembly of electronic components, including elemental electronic components, subassemblies or integrated circuits insertable into housings, and a system carrier having a surrounding injection-molded housing base of thermoplastic material, active zones of the electronic components and external electric terminals of the system carrier having electrical contacts connected by wires bonded thereto, the improvement therein comprising a web of thermoplastic material disposed between at least one of the contacts of the system carrier, on the one hand, and at least one of the contacts of the electronic components, on the other hand, and spacing the bonded wires away from the system carrier. These webs, for example, prevent short circuits of the bonding wire to the chip tray of the system carrier which is formed of electrically conductive material.

Advantageously, the webs are formed together with the housing bases in a single operation i.e. the injection-molding of the system carrier strips and molding of the webs to the system carriers are accomplished simultaneously in one mold.

Other features which are considered as characteristic for the invention are set forth in the appended claims.

Although the invention is illustrated and described herein as embodied in an electronic components and system carrier assembly, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DETAILED DESCRIPTION OF THE INVENTION

Figure 1:
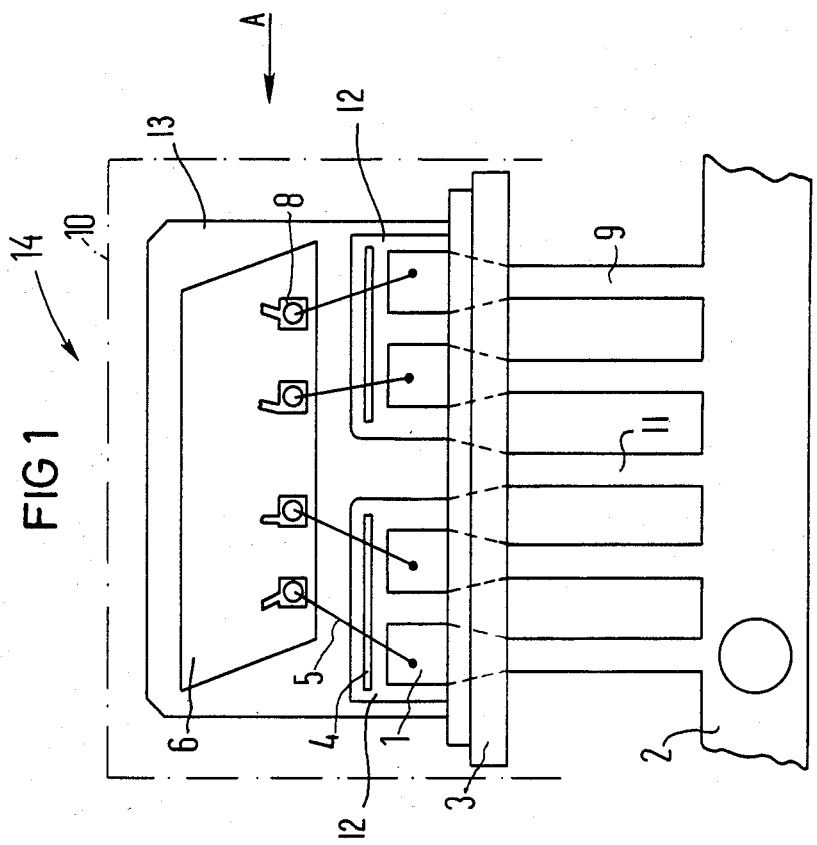
FIG. 1 is a diagrammatic top plan view of an SAW-filter in accordance with the invention, the housing being shown in phantom.
Figure 2:
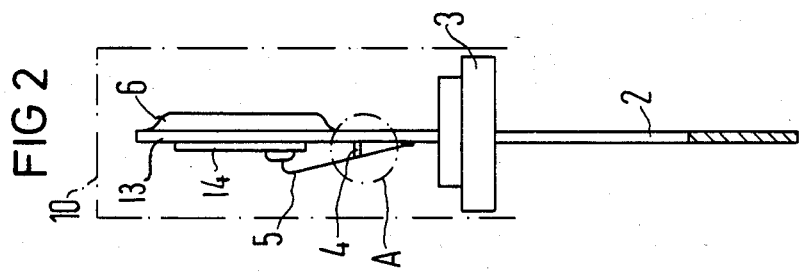
FIG. 2 is a side elevational view of FIG. 1.

Referring now to the drawing and first, particularly, to FIGS. 1 and 2 thereof, there is shown a SAW-filter 14 having a system carrier 2, a chip tray 6 and conventional external electrical and mechanical connecting or terminal elements 9. The system carrier 2 has a surrounding injection-molded housing base 3 of thermoplastic material and, in the fully assembled condition, is inserted into a cup-shaped housing 10 shown in phantom formed, for example, of plastic material or metal. The contacts 1 and 8, respectively, of the external electrical terminal elements 9 and of the active zones of the SAW-filter otherwise not shown in detail are bridged by arcuate wires 5 and secured thereto by wire bonding.

Figure 3:
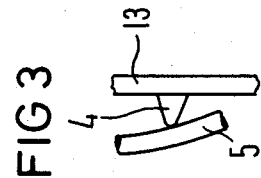
FIG. 3 is an enlarged fragmentary view of FIG. 2 showing an encircled detail thereof.

As shown in FIGS. 2 and 3, webs or ribs 4 of thermoplastic material about 0.05 to 0.1 mm high i.e. raised from the surface of the system carrier, are injection-molded onto the system carrier between the contacts 1 and 8. The webs 4 thus serve as spacers and prevent, for example, the formation of a short circuit between the wire 5 and the chip tray 6.

There are claimed:

1. In an assembly of electronic components and a system carrier of a SAW-filter having a surrounding injection-molded housing base of thermoplastic material, active zones of the electronic components and external electric terminals of the system carrier having electrical contacts connected by wires bonded thereto, the improvement therein comprising a web of thermoplastic material permanently secured to the system carrier and disposed between at least one of the contacts of the system carrier, on the one hand, and at least one of the contacts of the electronic components, on the other hand, and insulatingly spacing the bonded wires away from the system carrier.

2. Assembly according to claim 1 wherein said web is approximately 0.05 to 0.1 mm high.

* * * * *